United States Patent [19]

Tei

[11] Patent Number: 5,084,399
[45] Date of Patent: Jan. 28, 1992

[54] SEMI CONDUCTOR DEVICE AND PROCESS FOR FABRICATION OF SAME

[75] Inventor: Sadahiro Tei, Ebina, Japan

[73] Assignee: Fuji Xerox Co., Ltd., Japan

[21] Appl. No.: 237,687

[22] Filed: Aug. 25, 1988

Related U.S. Application Data

[63] Continuation-in-part of Ser. No. 778,367, Sep. 20, 1985, abandoned.

[30] Foreign Application Priority Data

Oct. 1, 1984 [JP] Japan .................. 59-205780

[51] Int. Cl.[5] .................................. H01L 31/18
[52] U.S. Cl. .............................. 437/3; 437/101; 437/71; 437/173; 437/239; 437/170
[58] Field of Search .............. 437/3, 101, 71, 173, 437/239, 233, 170, 2, 4, 5

[56] References Cited

U.S. PATENT DOCUMENTS

| 3,345,274 | 10/1967 | Schmidt ................. 204/15 |
| 3,345,275 | 10/1967 | Schmidt et al. ........... 204/15 |
| 3,377,258 | 4/1968 | Schmidt et al. ........... 204/15 |
| 3,404,073 | 10/1968 | Scott .................... 204/15 |
| 3,432,405 | 3/1969 | Pilling et al. ............ 204/15 |
| 3,961,355 | 6/1976 | Abbas et al. ............ 357/241 LR |
| 4,281,208 | 7/1981 | Kuwano et al. ........... 29/572 |
| 4,419,696 | 12/1983 | Hamano et al. ........... 357/24 LR |
| 4,507,181 | 3/1985 | Nath et al. .............. 204/15 |
| 4,527,007 | 7/1985 | Fuse .................... 29/572 |
| 4,569,728 | 2/1986 | Davari et al. ........... 204/15 |
| 4,660,277 | 4/1987 | Tei ..................... 437/226 |

OTHER PUBLICATIONS

Yamamoto et al., "Anodic Oxide Gate A-Si:H MOSFET", Electron Letters, vol. 19, #16, 8/4/83, pp. 607-608.
Izidinav et al., "An Ellipsometric Study . . . Alkali", Soviet Electrochemistry, vol. 11, #3, pp. 383-387, 3/75.
Arimoto et al., "A-Si:H MIS . . . Processes" Electron Letters, vol. 19, #16, 629-629, 8/4/83.
Ghandhi, S. K., "VLSI Fabrication Principles", 1983, pp. 568-573.

Primary Examiner—Brian E. Hearn
Assistant Examiner—Kevin McAndrews
Attorney, Agent, or Firm—Handal & Morofsky

[57] ABSTRACT

In a contact type image sensor prepared by disposing a plurality of sandwich type photoelectric conversion elements each of which is obtained by sandwiching an amorphous semiconductor layer as a photoelectric conversion layer between a metal electrode and a light-transmissive electrode, the amorphous semiconductor layer is insulated and separated by means of a silicon oxide layer in every element. The silicon oxide layer is obtained by oxidizing selectively the amorphous semiconductor layer in accordance with the optically assisted anodizing process.

9 Claims, 2 Drawing Sheets

SEMI CONDUCTOR DEVICE AND PROCESS FOR FABRICATION OF SAME

This application is a continuation-in-part of application Ser. No. 778,367, filed Sept. 20, 1985 now abandoned.

BACKGROUND OF THE INVENTION

This invention relates to semiconductor devices and a process for the fabrication of the same, and particularly to formation of insulating layers in accordance with optically assisted anodizing process.

Recently, high integration in semiconductor devices has been developed with remarkable rapidity so that the device has progressed from a small scale integrated circuit (SSI) to a very large scale integrated circuit (VLSI).

Such high integration of semiconductor integrated circuits is realized by miniaturizing elements. Thus fine and highly precise pattern formation technique has been desired earnestly.

For example, sandwich type photoelectric converting devices in which amorphous silicon layer is utilized as a photoelectric conversion layer have attracted attention lately in order to use them as contact type image sensors. This type of photoelectric converting device has generally a construction as shown in FIG. 1 wherein a plurality of metal electrodes 2 are juxtaposed on an insulating substrate 1, and thin hydrogenated amorphous silicon film as a photoelectric conversion layer 4 is sandwiched between these metal electrodes and a transparent electrode 3. In such construction of the photoelectric converters, it has been considered that the insulation between adjacent electrodes is sufficient, because a distance D between the adjacent electrodes is generally ten or more times larger than the thickness d of the thin hydrogenated amorphous silicon film. In other words, because the distance between the adjacent electrodes is 10 or more times the thickness of the thin hydrogenated amorphous silicon film, the insulation across the adjacent electrodes is sufficiently assured for the practical use of the photoelectric converter. However, such problems as described hereinbelow appear more frequently as the density of the elements becomes higher in order to improve the resolution of the reproduced image. In other words, as the density of elements becomes higher in order to improve the resolution in the reproduced image, such problems as described hereinbelow arise. Namely, in making the density of the elements higher, since area of each electrode must be maintained, distance between the electrodes, i.e., the distance D, should be smaller. Thus, the distance D of the electrodes becomes close to the thickness d of the hydrogenated amorphous silicon film, i.e., distance between the metal electrode 2 and the transparent electrode 3. As a result, the insulation between the metal electrodes becomes insufficient. Thus, there will arise a problem in which a current is likely to flow across adjacent electrodes through the photoelectric conversion layer, resulting in lowering the performance of the photoelectric converters as a sensor.

To solve the above problem, there has been proposed, as shown in FIG. 2, a construction wherein an auxiliary electrode 5 having a width l is disposed between the metal electrodes each having a width L (l<<L) and juxtaposed on an insulating substrate with a distance $D_1$. At the same time, a bias having the same polarity with that of the transparent electrode is applied to the auxiliary electrodes.

According to the above construction, a current will not flow across adjacent electrodes through the photoelectric conversion layer. However, there is a limit to the shortening of the distance $D_1$ between the metal electrodes due to the existence of the auxiliary electrodes. In addition, the cost for the production becomes expensive because the number of fabricating processes, including the formation process for auxiliary electrodes, is increased.

Furthermore, in semiconductor devices having an amorphous semiconductor layer other than a contact type image sensor, when an amorphous semiconductor layer is subject to a patterning operation in accordance with a photolithographic method or the like, deterioration due to contamination by impurities and the like is likely to occur. Besides, the amorphous semiconductor layer is weak in the context of high-temperature processing. Hence it is very difficult to form an oxide layer after formation of the amorphous semiconductor layer.

SUMMARY OF THE INVENTION

It is an object of the present invention to provide a highly integrated semiconductor device with high reliability which is easily and economically fabricated.

Another object of the present invention is to improve the reliability of a contact type image sensor with high resolution and a high density of photoconductive conversion elements.

Still another object of the present invention is to provide a method for fabricating a sandwich type photoelectric converting device having a small distance between the electrodes of the adjacent photoelectric conversion elements in which an electric charge does not move into adjacent divided electrodes and which exhibits favorable sensor characteristics.

To achieve the above objects, according to the present invention, when an insulating layer is formed in a semiconductor device having an amorphous semiconductor layer such as amorphous silicon layer, compound semiconductor layer or the like, the semiconductor layer is selectively or wholly oxidized, using an optically anodizing process.

For instance, as shown in FIGS. 3(a) and (b), in forming a sandwich type photoelectric converting device composed of metal electrodes 12 juxtaposed on an insulating substrate 11, a light transmissive electrode 13, a hydrogenated amorphous silicon layer 14 as a photoelectric conversion layer sandwiched with said metal electrodes and said light transmissive electrode 13, and an insulating silicon oxide layer 15 as an isolation layer, after forming the metal electrodes 12 a hydrogenated amorphous silicon layer is formed, and then the layer thus formed is selectively subjected to optically assisted anodization to convert the hydrogenated amorphous silicon layer existing between adjacent bits (photoelectric conversion elements) into an insulating silicon oxide layer 15. As a result, complete isolation between the bits and precise definition of the area for sensor bits can be effected, whereby a photoelectric converting device with sensors being arranged in high density can be easily formed.

According to the present invention, an amorphous semiconductor layer is selectively or wholly oxidized using the optically assisted anodizing process when an insulating layer is formed in a semiconductor device having the amorphous semiconductor layer. Hence the oxidizing reaction proceeds at a high speed and is easily controlled.

Futhermore, according to the present invention, the oxidizing reaction takes place without exposing the substrate to to high temperature. As a result, the substrate will not be damaged, and it becomes possible to easily and inexpensively fabricate semiconductor devices.

In particular, in separating the photoelectric conversion elements which are juxtaposed in high density, a hydrogenated amorphous silicon layer serving as a photoelectric conversion layer is optically anodized to convert the layer to an insulating layer only the portions of the layer positioned between the elements, so that the device can easily and inexpensively be fabricated. In such devices, with the separation between elements movement of electric charge between adjacent bits is prohibited, whereby favorable sensor characteristics can be obtained. Moreover, since the insulation and separation can be made by optically assisted anodization with accuracy, it is possible to form elements with higher density so that the resulting device has very high reliability. In addition, while the area of indium-tin-oxide electrodes has conventionally been defined by means of a metal mask, using sputtering to deposit these electrodes, the definition of area is made on the photoelectric conversion layer itself. Therefore, no definition for the area of indium-tin-oxide becomes necessary.

BRIEF DESCRIPTION OF THE DRAWINGS

In the accompanying drawings:

FIGS. 3(a) and 3(b) are schematic diagrams showing a contact type image sensor in accordance with an embodiment of the present invention wherein FIG. 3(a) is a sectional view taken along line a—a of FIG. 3(b); and FIGS. 4 through 8 are diagrams each illustrating a fabricating process for the contact type image sensor shown in FIGS. 3(a) and 3(b) wherein FIG. 7 is a diagram showing an optically assisted anodizing device.

DETAILED DESCRIPTION OF THE INVENTION

A method for the fabrication of a contact type image sensor according to the present invention will be described in detail hereinbelow by referring to the accompanying drawings.

Referring to FIGS. 3(a) and 3(b), the method is intended to ensure isolation between adjacent photoelectric conversion elements and at the same time, to define the photoelectric conversion areas by converting the photoelectric conversion layer between the elements, into an insulating layer 15 in accordance with optically assisted anodizing process.

Figure 4:
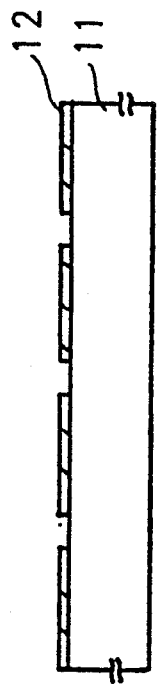

First of all, a thin chrominum film is formed on an insulating ceramic substrate 11 in accordance with a metallizing method, and then the film is processed to form chromium electrodes 12 in the form of divided electrodes having a suitable shape as shown in FIG. 4 in accordance with photolitho-etching technique.

Figure 5:
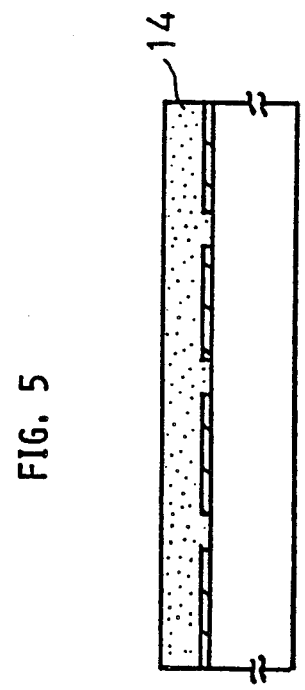

Then, a hydrogenated amorphous silicon layer (a-Si:H) 14 of about 1um thickness is selectively deposited in the form of continuous strip through a metal mask over the chromium electrodes 12 using the plasma CVD method as shown in FIG. 5 with depositing conditions being 200°–250° C. for substrate temperature, 1–100 W for electric power, and 1–50 sccM/min for flow rate of monosilane.

Figure 6:
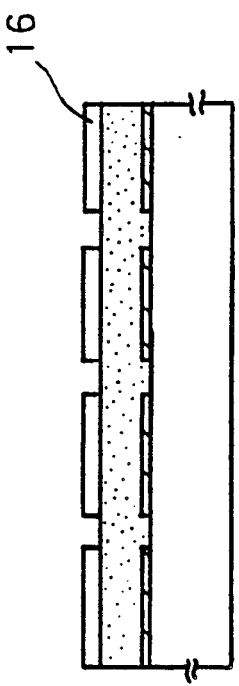

Thereafter, a negative type resist such as that acrylic resin sold by Tokyo Ohka K. K. under the trade mark of OMR is applied to the hydrogenated amorphous silicon layer, and then a resist pattern 16 is formed as shown in FIG. 6 by using a photomask (not shown) having a pattern corresponding to shapes of the chromium electrodes 12 in accordance with photolitho-etching technique. In this case, the negative type resist is coated into a resist film of 1um by a spincoater under at 2,000 rpm per second using an OMR whose viscosity is 10 c. p. Then, after being processed in a prebaking process at 90° C., for five minutes, the resist film is exposed selectively in the given pattern at an exposure of 5 mJ/sec, is developed by methyl ethyl ketone (MEK) at a temperature of 25° C. for 60 seconds, is rinsed with isopropyl alcohol (IPA) for 30 seconds, and then is processed in a postbaking process step at 120° C., for 10 to 15 minutes.

Figure 7:
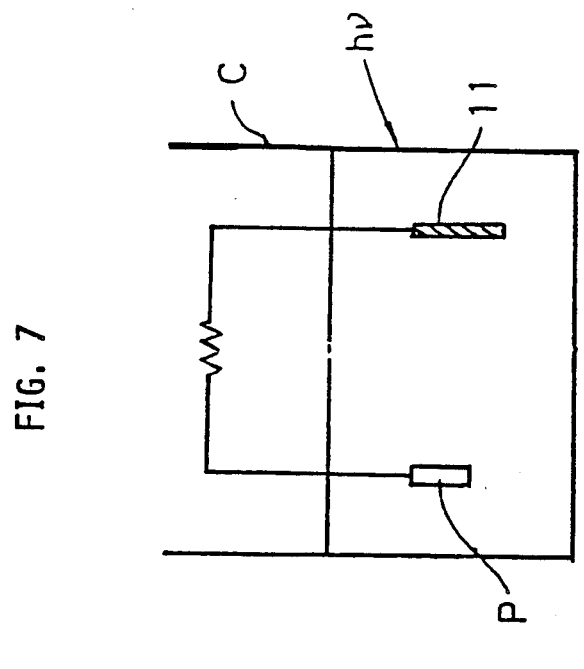
Figure 8:
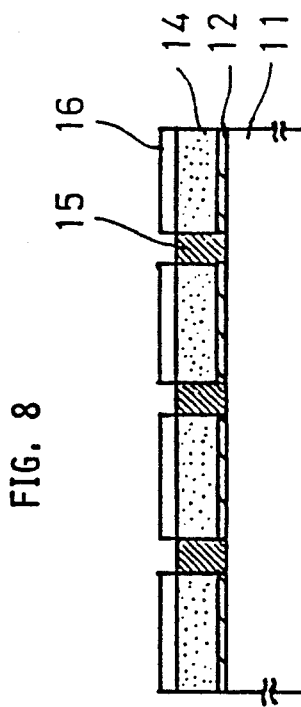

Then, aqueous potassium sulfate ($K_2SO_4$) solution, of 0.1N as an electrolytic solution, is poured into a cell C having a light-receiving surface as shown in FIG. 7. The ceramic substrate 11 is immersed, in the cell and optically assisted anodization is carried out for about 5 minutes in such a manner that a platinum electrode P is used as an opposite electrode, and the ceramic substrate 11, as the anode, is irradiated with light emitted from a 500 W xenon lamp. In this case the current for the optical anodization is 0.1 mA–1A, and the lamp intensity is between 1 and 10 mW/cm$^3$ on the surface. Thus, photooxidation proceeds in the region uncovered with the resist pattern, i.e., the surface in contact with the electrolytic solution, whereby the hydrogenated amorphous silicon layer around the chromium becomes the insulating silicon oxide layer 15 as shown in FIG. 8.

Figure 1:
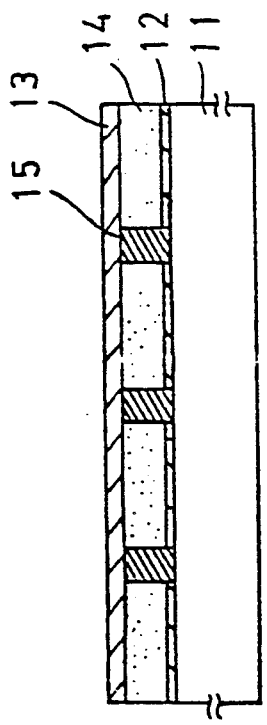
FIGS. 1 and 2 are schematic diagrams each showing a conventional contact type image sensor.
Figure 2:
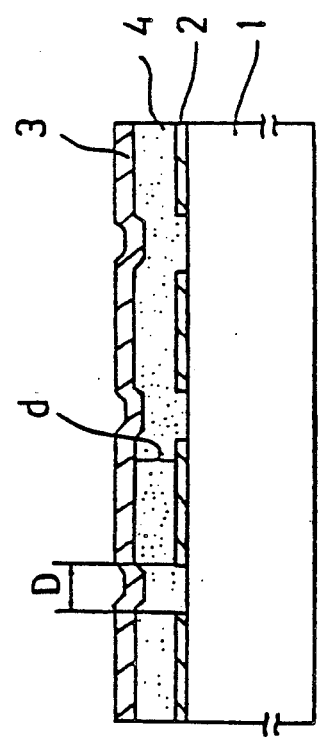
Figure 3:
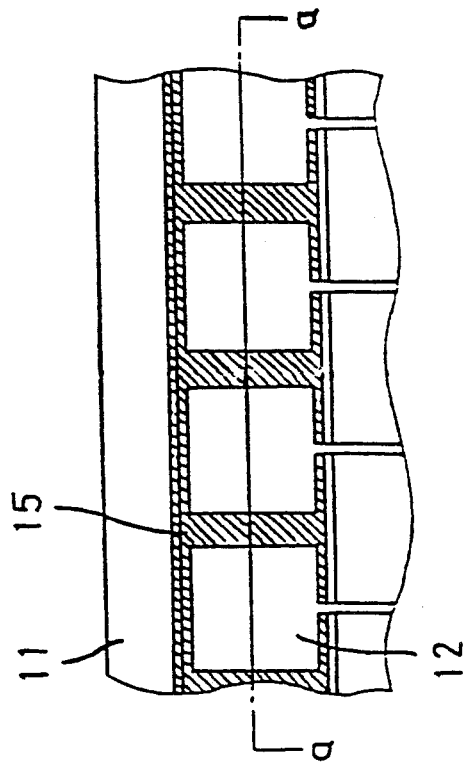
Figure 3:
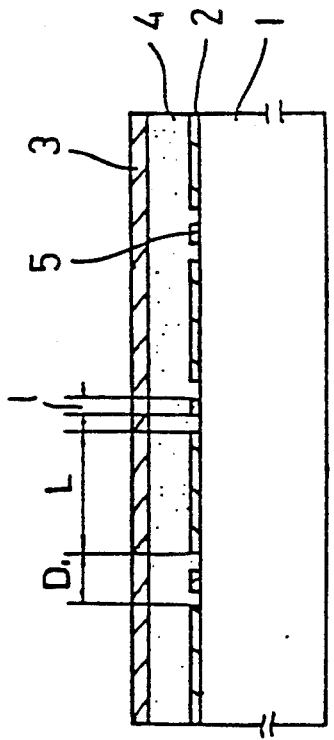

Then, the resist pattern is removed with use of a resist releasant, and thereafter an indium-tin-oxide (ITO) electrode 13 is formed as a transparent electrode in accordance with sputtering process thereby completing the fabrication of a photoelectric converting device used as a contact type image sensor as shown in FIG. 3.

The photoelectric converting device thus formed has a construction wherein the hydrogenated amorphous silicon layer as a photoelectric conversion layer is insulated and separated by means of the insulating layer 15 provided for every bit, so that the adjacent bits can be separated sufficiently. Thus, there is no need for providing auxiliary electrodes as in the conventional case.

According to this embodiment, the insulating layer is not newly formed, but is formed by optically assisted anodizing the hydrogenated amorphous silicon layer which has already been formed. In the optically assisted anodizing process, no high-temperature processing is performed. Therefore, the layers which have already been formed are scarcely affected during the formation of the insulating layer, and as a result a uniform insulating layer with dimensional accuracy is easily fabricated.

Further, in the case where the photoelectric conversion elements are disposed with high density and the distance D between the adjacent electrodes has a value close to the thickness of the photoelectric conversion layer, an insulating layer having a precise minute pattern can be formed by optically assisted anodization. This is because light is passed to the transparent hydrogenated amorphous silicon in the region uncovered by the resist pattern, thus effecting a high-speed reaction. Hence, as described above, the formation of the elements in high density can be effected easily, precisely, and inexpensively so that an image sensor having favorable photoelectric converting characteristics can be produced. In this case, the resist pattern is not limited to be of the negative type, but a positive type resist pattern such as that sold under the trademark OFPR or the like may also be used and it is more effective to utilize a resist pattern of light shielding property. Although aqueous potassium sulfate solution has been used as an electrolyte in the optically assisted anodization according to the forgoing embodiment, the present invention is not limited to this, but an electrolyte containing other supporting electrolytes such as sodium sulfate ($Na_2SO_4$) and the like may be employed. Furthermore, an aluminum (A/) electrode, carbon electrode or the like other than platinum electrode may also be used as the opposing electrode.

Furthermore, the present invention is applied not only to image sensors, but it is also applicable to other devices such as a thin film transistor (TFT) and the like in separating the element from each other as well as for other purposes, and in these applications, favorable results can be obtained. In addition, materials to be optical-anodized are not limited to hydrogenated amorphous silicon layer, but they may be amorphous semiconductor layers of cadmium sulfate, cadmium selenide (CdSe), selenium (Se), tellurium (Te), cadmium telluride (CdTe) or the like.

I claim:

1. A method for fabricating a semiconductor device as an document reading device of the type wherein a plurality of sandwich type photoelectric conversion elements are juxtaposed, said semiconductor device being prepared by the steps of:

forming a plurality of first electrodes on a substrate;
   forming a continuous strip of hydrogenated amorphous silicon layer on said first electrodes as a photoelectric conversion layer;
   converting a portion of said hydrogenated amorphous silicon layer corresponding to each region between adjacent ones of said first electrodes into an insulating silicon oxide layer by optically assisted anodization, and
   forming a second electrode on said insulating silicon oxide layer.

2. The method as claimed in claim 1 wherein each of said first electrodes is a metal electrodes, and said second electrode is a transparent electrode.

3. The method as claimed in claim 2 wherein each of said first electrodes is made of chromium, and said second electrode is made of indium-tin-oxide.

4. A method for fabricating a semiconductive device comprising the steps of:
   (a) forming a thin chromium film on an insulated ceramic substrate;
   (b) processing said film to form a plurality of chromium electrodes using a photolitho-etching technique;
   (c) depositing a hydrogenated amorphous silicon layer in the form of strips over said chromium electrodes using the plasma CVD method;
   (d) depositing a resist over said hydrogenated amorphous silicon layer;
   (e) forming a pattern in said resist;
   (f) placing said substrate with said members disposed on it in an aqueous electrolytic solution;
   (g) optically anodizing said amorphous silicon by:
      (i) exposing it to radiation while
      (ii) electrically connecting it to a metallic member disposed in said electrolytic solution; and
   (h) applying a transparent electrode over said photoanodized layer whereby a transparent electrode covers a plurality of amorphous silicon electrodes separated by insulative oxidized material.

5. A method for fabricating a semiconductive device comprising the steps of:
   (a) forming a thin chromium film on an insulated substrate;
   (b) processing said film to form a plurality of metallic electrodes using a photolitho-etching technique;
   (c) depositing a hydrogenated amorphous silicon layer in the form of strips over said metallic electrodes;
   (d) depositing a resist over said amorphous silicon layer;
   (e) forming a pattern in said resist;
   (f) placing said substrate with said members disposed on it in an electrolytic solution;
   (g) optically anodizing said amorphous silicon by:
      (i) exposing it to radiation while
      (ii) electrically connecting it to a metallic member disposed in said electrolytic solution; and
   (h) applying a transparent electrode over said photoanodized layer whereby a transparent electrode covers a plurality of amorphous silicon electrodes separated by insulative oxidized material.

6. A method for fabricating an image sensor comprising a plurality of sandwich type photoelectric conversion elements juxtaposed to each other on a substrate, said image sensor being prepared by the steps of:
   (a) forming a plurality of first electrodes on said substrate;
   (b) forming a hydrogenated amorphous semiconductor layer in the shape of a continuous stripe on said first electrodes as a photoelectric conversion layer;
   (c) converting selectively a portion of said hydrogenated amorphous semiconductor layer corresponding to each region between adjacent ones of said first electrodes into an insulating semiconductor oxide layer by optical anodization, said insulating semiconductor layer isolating adjacent photoelectric conversion element; and
   (d) forming a second electrode on said hydrogenated semiconductor layer.

7. A method as claimed in claim 6, wherein said step of forming a hydrogenated amorphous semiconductor layer is performed by forming a hydrogenated amorphous silicon layer.

8. The method as claimed in claim 7, wherein said first electrode is a metal electrode, and said second electrode is a transparent electrode.

9. The method as claimed in claim 8, wherein said first electrode is made of chromium, and said second electrode is made of indium-tin-oxide.

* * * * *